INVENTOR.
Meritt L. Miller,
BY Henry J. Mariniak
Attorney.

March 29, 1966 M. L. MILLER 3,243,727

SEMICONDUCTOR INVERTER CIRCUIT WITH VOLTAGE REDUCING MEANS

Filed April 1, 1964 2 Sheets-Sheet 2

INVENTOR.
Meritt L. Miller,
BY Henry J. Marcinick
Attorney.

3,243,727
Patented Mar. 29, 1966

3,243,727

SEMICONDUCTOR INVERTER CIRCUIT WITH VOLTAGE REDUCING MEANS

Meritt L. Miller, Fort Wayne, Ind., assignor to General Electric Company, a corporation of New York Filed Apr. 1, 1964, Ser. No. 356,438
8 Claims. (Cl. 331—113)

Figure 1:
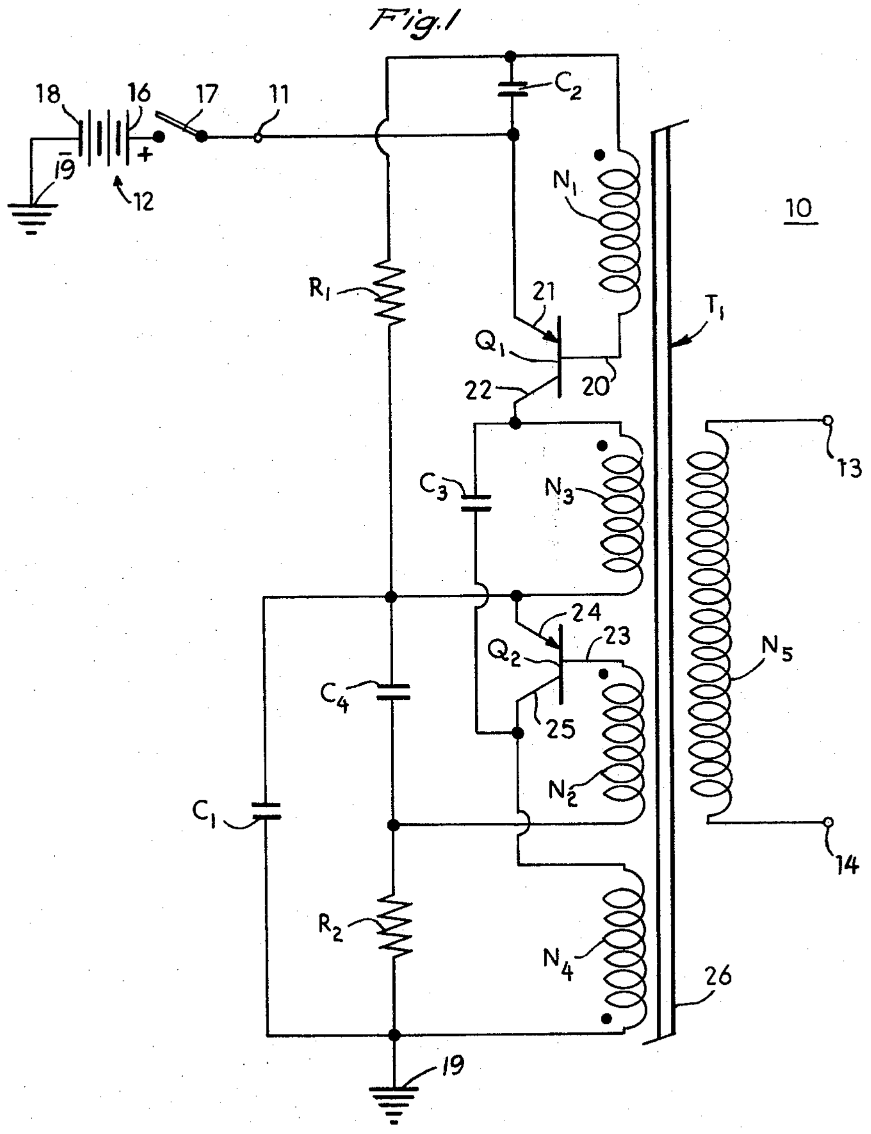

This invention relates to electrical oscillators and more particularly to such electrical oscillators using semiconductor devices such as transistors for obtaining an alternating output from a direct current supply.

Ferro-resonant transistor oscillators have been used in the past for obtaining an alternating current from a direct current supply and are attractive circuits because of their high efficiency. One well known ferro-resonant transistor oscillator utilizes a saturating transformer having a primary winding and a saturable core with a rectangular hysteresis loop characteristic. Two transistors are connected in parallel and alternately switched on in response to the condition of saturation of the core to reverse the current to the primary winding. Thus, an alternating voltage is induced in a secondary winding inductively coupled with the primary winding on the saturable core, the saturable core serving as the frequency determining element. The alternating voltage output has a substantially rectangular waveform and a half cycle period that is proportional to the time required for the transformer core to become saturated after each reversal of the conducting condition of the transistors.

In such a conventional circuit arrangement, the transistors must be capable of handling twice the supply voltage. Since transistors are essentially current devices, the requirement that the transistors handle twice the supply voltage poses a problem. In fact, it is desirable generally to operate transistors at the lowest possible voltages. Additionally in most applications transistors with relatively lower voltage ratings are preferred because they are less expensive.

Accordingly, an object of the present invention is to provide an improved electrical oscillator using semiconductor devices for operation from a D.C. source.

A more specific object of the present invention is to provide an improved electrical oscillator wherein the peak voltage requirement of the transistor is substantially reduced.

It is another object of the present invention to provide an improved electrical oscillator employing transistors wherein only a part of the source voltage appears across the transistors.

A further object of the present invention is to provide an improved electrical oscillator wherein the waveform of the rectangular wave output of the oscillator can be readily adjusted.

In accordance with one form of my invention I have provided an improved electrical oscillator of the ferro-resonant type. The electrical oscillator is comprised of first and second semiconductor devices, such as PNP transistors, and a saturating transformer. The transformer includes a saturable core, a first and a second primary winding, a first and a second bias winding inductively coupled therewith on the saturable core, and an output winding also inductively coupled with the primary windings on the saturable core. Further, a first control means that includes the first bias winding is provided for driving the first semiconductor device into a conducting condition in response to the saturation of the magnetic core in one direction. And a second control means that includes the second bias winding is provided for driving the second semiconductor device into a conducting condition in response to the saturation of the magnetic core in the opposing direction. The first and a second semiconductor devices are connected in circuit with a D.C. source and a storage capacitor so that the first and second primary windings of the saturating transformer are alternately energized by the current supplied from the D.C. source and from the storage capacitor as the semiconductor devices are alternately switched "on" and "off."

In another aspect of the invention a voltage dividing network having a tapping connection is connected across the primary windings of the saturating transformer and the first and second semiconductor devices. The tapping connection is joined with a junction between the serially connected first semiconductor device and first primary winding and the serially connected second semiconductor device and second primary winding. With this arrangement, it is possible to effectively limit the voltage applied across the semiconductor devices. By adjusting the tapping connection of the voltage dividing network, it is also possible to selectively balance and unbalance the rectangular wave voltage output as may be desired in a particular application.

An important advantage of the improved oscillator is that it is possible to utilize semiconductor devices having relatively lower voltages as will hereinafter be more fully explained.

Figure 2:
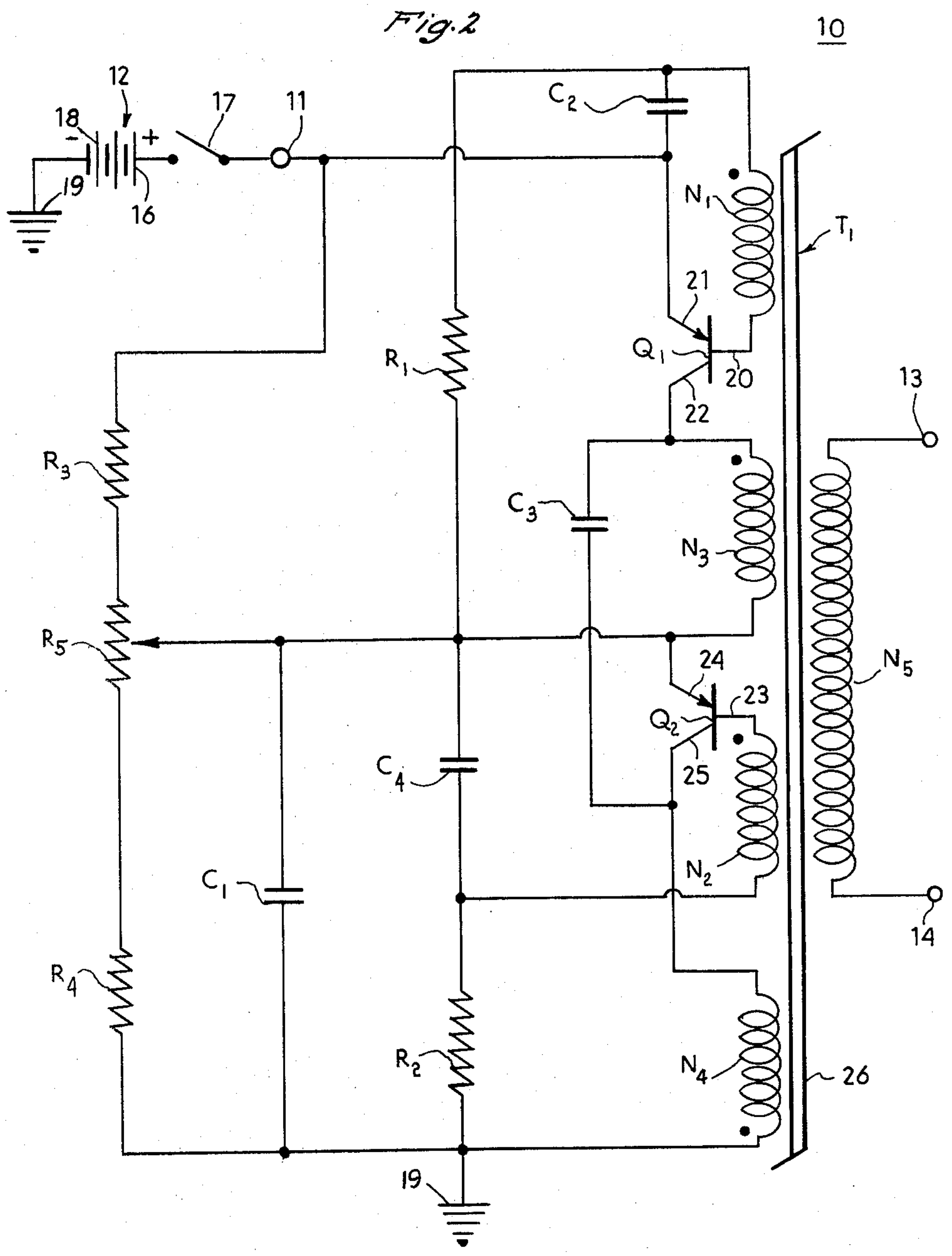

The subject matter which I regard as my invention is set forth in the appended claims. The invention, itself, however, together with further objects and advantages thereof may be understood by referring to the following description taken in conjunction with the accompanying drawings in which:

FIGURE 1 is a schematic circuit diagram of an electrical oscillator embodying one form of my invention; and FIGURE 2 is a schematic circuit diagram of the electrical oscillator shown in FIGURE 1 incorporating a modification for controlling the voltage across the storage capacitor of the oscillator.

Referring now more particularly to the drawing, I have illustrated in FIGURE 1 an oscillator represented generally by the numeral 10 and embodying one form of the present invention. The oscillator 10 includes a terminal 11 for connection to a source of unidirectional voltage which is represented schematically by the battery 12 and also includes a pair of output terminals 13 and 14. The battery 12 is illustrated as having a positive plate 16 connected in circuit with a switch 17 and a negative plate 18 connected in circuit with a ground 19.

The semiconductor switching devices used in the illustrative embodiment of the invention are preferably transistors generally identified in the drawing as $Q_1$ and $Q_2$. The transistors $Q_1$ and $Q_2$ are of the PNP junction type with the transistor $Q_1$ having a base electrode 20, an emitter electrode 21 and a collector electrode 22. Similarly, the transistor $Q_2$ includes a base electrode 23, an emitter electrode 24 and a collector electrode 25. In the illustrated exemplification of my invention the transistors $Q_1$ and $Q_2$ are operated in a switching mode. When a base electrode of the transistors $Q_1$ and $Q_2$ is negative with respect to the emitter electrode, the transistor is driven into a saturated or conducting condition wherein the resistance between the emitter and collector electrodes becomes relatively small. When a reverse or back bias is applied between the emitter and base electrodes of the transistor, the resistance between the emitter and collector electrodes becomes relatively large and the transistor is in a nonconducting or high impedance condition.

It will be seen that the oscillator 10 includes a saturating transformer $T_1$ having a magnetic core 26, primary windings $N_3$ and $N_4$ and second windings $N_1$, $N_2$ and $N_5$ inductively coupled on the magnetic core 21 with relative polarities indicated by the dots. Preferably, the material utilized in the magnetic core 26 has a substantially rectangular hysteresis loop characteristic and is designed for magnetic saturation in the range of energization of the saturating transformer $T_1$.

The windings $N_1$ and $N_2$ are arranged with respect to the base electrodes 20 and 23 respectively of transistors $Q_1$ and $Q_2$ so that when the polarity of voltage induced across the winding $N_1$ is such that the potential applied at the base electrode 20 is negative with respect to the emitter electrode 21, the polarity of the voltage induced across the winding $N_2$ is such that the potential at the base electrode 23 is positive with respect to the emitter electrode 24. The windings $N_1$ and $N_2$ are coupled with the transistors $Q_1$ and $Q_2$ to alternately switch them "on" and "off" and thereby causing current to flow from the source 12 through the primary winding $N_3$ and to a storage capacitor $C_1$ when transistor $Q_1$ is switched "on" and to cause the capacitor $C_1$ to discharge through the primary winding $N_4$ when transistor $Q_1$ is switched "off" and transistor $Q_2$ is switched "on."

The resistive values of the resistors $R_1$ and $R_2$ were selected to insure that the transistors $Q_1$ and $Q_2$ are saturated when the bias potential applied by the windings $N_1$ and $N_2$ respectively is of such polarity that transistors are driven to a conducting condition. In oscillators where a balanced waveform is desired, the resistive value of the resistor $R_2$ is adjusted to provide a voltage across the storage capacitor $C_1$ that is approximately one half of the supply voltage. The capacitive value of the storage capacitor $C_1$ is preferably selected so that during continuous operation the oscillator ripple voltage is maintained within selected limits. The capacitive values of the capacitors $C_2$ and $C_4$ were experimentally selected to insure that the transistors $Q_1$ and $Q_2$ are quickly turned off when the polarity across the windings $N_1$, $N_2$ reverses to drive the transistors into a nonconducting condition. During the conducting interval of transistor $Q_1$, capacitor $C_2$ is charged so that the plate connected in circuit with the base electrode 20 has a positive charge. Similarly, during the conducting interval of transistor $Q_2$, the lower plate of capacitor $C_4$ as seen in FIGURE 1, has a positive charge. This arrangement insures a prompt turn-off of transistors $Q_1$ and $Q_2$.

A capacitor $C_3$ is connected in circuit with the collector electrodes 22 and 25 of the transistors $Q_1$ and $Q_2$ to prevent voltage spikes from the load causing a misfiring. The capacitive value of the capacitor $C_3$ was determined experimentally and will depend upon the particular application of the oscillator 10.

The operation of the oscillator 10 will now be more fully described according to the present understanding of the invention. With the switch 17 closed the capacitor $C_2$ is initially charged so that the upper plate as seen in FIGURE 1 is negative thereby rendering the base electrode 20 negative with respect to the emitter electrode 21 and switching the transistor $Q_1$ into conducting condition. Current now flows from the unidirectional source 12 through the transistor $Q_1$, the primary winding $N_3$ to charge the storage capacitor $C_1$ to approximately half of the source voltage. The current flow through the primary winding $N_3$ causes a voltage to be induced in the bias winding $N_1$ having a polarity such that the end connected with the base electrode 20 of transistor $Q_1$ is negative and the upper end is positive. Thus, the transistor $Q_1$ is in a conducting condition, and capacitor $C_2$ is charged with a voltage that renders its upper plate, as seen in FIGURE 1, positive with respect to the lower plate. During this interval the polarity of the voltage induced across the bias winding $N_2$ is such that the upper end of the winding, as seen in FIGURE 1, is positive. Thus, during this interval transistor $Q_2$ is held in a nonconducting condition.

Due to the current flowing through the primary winding $N_3$, the flux within the saturable magnetic core 26 begins to change until the core 26 reaches the point of saturation. When the magnetic core 26 saturates, it can no longer support voltage, and the voltage across the bias windings $N_1$ and $N_2$ tends to collapse. When this occurs, transistor $Q_1$ is turned off, and the sudden collapse of the voltage across the bias winding $N_2$ results in a voltage spike which switches transistor $Q_2$ into a conducting condition.

During the conducting condition of transistor $Q_2$, the unidirectional power source 12 is in effect disconnected from the circuit due to the high impedance of the transistor $Q_1$ and the impedance presented by the resistor $R_1$. The storage capacitor $C_1$ now supplies energy to the saturating transformer $T_1$ and discharges through the primary winding $N_4$. Magnetic flux now builds up linearly in the magnetic core to its negative saturation level. During this interval the negative half wave of the square wave voltage is induced across the output winding $N_5$. When the magnetic core 26 saturates in the negative direction, the condition of the transistors $Q_1$ and $Q_2$ is reversed. Transistor $Q_1$ is now in a conducting condition while transistor $Q_2$ is switched off and the cycle of operation is repeated.

During operation the primary windings $N_3$ and $N_4$ are alternately energized from the source 12 and the storage capacitor $C_1$ in response to the condition of saturation of the magnetic core 25. As a result, an alternating square wave voltage is induced in the secondary winding $N_5$ due to transformer action. The square wave output voltage may be applied directly to an appropriate load or it may be first rectified, filtered and then applied to a load requiring a D.C. voltage. The frequency of the square wave voltage is proportional to the frequency of reversal of the operating conditions of the transistors $Q_1$ and $Q_2$. It will be apparent that this frequency of reversal is dependent upon the time required for the magnetic core 26 to shift from a condition of saturation in one direction to saturation in the opposing direction. Thus, the frequency may be varied by adjusting the number of turns in the windings $N_1$, $N_2$, $N_3$ and $N_4$ or by changing the magnitude of the supply voltage.

An oscillator according to the schematic circuit diagram shown in FIGURE 1 was actually constructed and tested for operation from a 30 volt D.C. supply. The following circuit constants are listed herein by way of specific exemplification of the invention:

| | |
|---|---|
| Transistors $Q_1$, $Q_2$ | 2N1924. |
| Transformer $T_1$: | |
| Primary windings $N_3$, $N_4$ | 91 turns of No. 32 wire. |
| Secondary windings $N_1$, $N_2$ | 13 turns of No. 27 wire. |
| Output winding $N_5$ | 20 turns of No. 27 wire. |
| Resistor $R_1$ | 2200 ohms. |
| Resistor $R_2$ | 2190 ohms. |
| Capacitor $C_1$ | 50 microfarads, 50 volts. |
| Capacitor $C_2$, $C_4$ | 0.1 microfarad. |
| Capacitor $C_3$ | .0022 microfarad. |

It will be understood that the various specific circuit constants which have been described above are intended by way of illustration of a specific exemplification of the invention and that the invention is not limited thereto. Although PNP transistors are shown in the illustrated embodiments of the present invention, it will be apparent that the NPN transistors and other semiconductor devices may be used in practice of the present invention.

Having reference now to FIGURE 2 I have illustrated therein a modification of the oscillator 10 shown in FIGURE 1 wherein a voltage dividing network is included to provide an adjustable control over the voltage across the storage capacitor $C_1$. The network includes resistors $R_3$, $R_4$ and a variable resistor $R_5$. The variable resistor or potentiometer $R_5$ can be used to balance or unbalance the waveform of the output across the terminals 13 and 14. Since the oscillator 30 shown in FIGURE 2 operates in essentially the same manner as the oscillator 10 of FIGURE 1, I have identified the corresponding parts thereof by the same reference numerals and letters.

In the oscillator 30 shown in FIGURE 2, the relative time of the upper and lower excursions of the rectangular wave is adjusted by setting the tapping connection 31 on the potentiometer $R_5$. When the potentiometer $R_5$ is set to provide a voltage across the storage capacitor $C_1$ that is less than one half of the supply voltage, the magnitude of the voltage during the negative half cycle of the rectangular wave output will be less than the voltage during the positive half cycle but will be of longer duration.

From the foregoing description it will be apparent that an improved oscillator is provided wherein a square wave output is produced from a D.C. source utilizing transistors having lower voltage ratings as compared with comparable circuits utilizing transistors in a parallel circuit configuration. In the improved circuit arrangement the transistors can be connected so that only half of the supply voltage appears across the transistors. An important advantage resulting from the use of transistor having lower voltage ratings is that it is possible to make more economic utilization of the transistors.

It will be understood that the square wave oscillators described herein are intended as illustrative examples of the invention and that the invention is not limited to such embodiments as are described herein. Also, it will be apparent that many modifications to these embodiments may be made. It is therefore to be understood that I intend by the appended claims to cover all such modifications that fall within the true spirit and scope of the invention.

What I claim as new and desire to secure by Letters Patent of the United States is:

1. An electrical oscillator comprising at least one input terminal lead for connection with a source of unidirectional current; a voltage translating means including a saturable magnetic core, a first and a second primary winding, a first and a second bias winding inductively coupled thereon, and an output winding also inductively coupled with the primary windings on the saturable magnetic core; a first and a second semiconductor device, each of said devices having at least emitter, collector, and control electrodes; control means connecting said first bias winding between said control electrode and a second electrode of said first semiconductor device for applying a biasing potential to said control electrode and said second electrode of said first semiconductor device; control means connecting said second bias winding between said control electrode and a second electrode of said second semiconductor device for applying a biasing potential to said control electrode and said second electrode of said second semiconductor device; each of said semiconductor devices having a substantially non-conducting condition for one polarity of applied biasing potential and a conducting condition for the opposite polarity of applied biasing potential, said applied biasing potential being alternately reversed in response to the condition of saturation of said magnetic core; a storage capacitor; a first electrical path connecting said input terminal lead in circuit with said emitter and collector electrodes of said first semiconductor device, said first primary winding, and said storage capacitor, said first semiconductor device when driven to a conducting condition causing said first primary winding to be energized and said storage capacitor to be charged; and a second electrical path connecting said emitter and collector electrodes of said second semiconductor device in circuit with said storage capacitor and said second primary winding, said second semiconductor device when driven into a conducting condition in response to the reversal to the polarity across the second bias winding causing said storage capacitor to discharge through said second semiconductor device and said primary winding, said first and second primary windings being alternately energized from the unidirectional current source and from said storage capacitor to cause an alternating voltage to be induced in said output winding.

2. An electrical oscillator comprising: a saturating transformer having a saturable core, a first and a second primary winding, a first and a second bias winding, and an output winding all inductively coupled on said saturable core, an input terminal for connection with a unidirectional source, a first and a second semiconductor device, each of said devices having an emitter, collector and base electrode, first control means including said first bias winding coupled between said base and one other electrode of said first semiconductor device for driving said first semiconductor device and switching said first semiconductor device into a conducting condition in response to the saturation of said magnetic core in one direction, a second control means including said second bias winding coupled between said base and one other electrode of said second semiconductor device for driving said second semiconductor device and switching said second semiconductor device into a conducting condition in response to the saturation of said magnetic core in the opposing direction, a storage capacitor, circuit means connecting said input terminal, said emitter and collector electrodes of said first semiconductor device, said first primary winding and said storage capacitor in a first electrical path to cause current to flow from the unidirectional current source through said first primary winding and said storage capacitor when said first semiconductor device is in the conducting condition, and circuit means connecting said storage capacitor in circuit with said emitter and collector electrodes of said second semiconductor device, and said second primary winding to provide a second electrical path for the discharge of current from said storage capacitor to energize said second primary winding when said second semiconductor device is in a conducting condition, said first and second primary windings being alternately energized from the unidirectional current source and from said storage capacitor by the switching of said semiconductor devices to cause an alternating voltage to be induced in the output winding.

3. The electrical oscillator set forth in claim 2 wherein a capacitor is connected in circuit with said collector electrode of said first semiconductor device and with said collector electrode of said second semiconductor device to thereby minimize misfiring of said semiconductor devices.

4. An electrical oscillator comprising first and second input terminals for connection with a source of unidirectional current; a voltage translating means, means including a saturable magnetic core, a first and a second primary winding, a first and a second bias winding and an output winding all inductively coupled therewith on said saturable magnetic core, a first and a second PNP transistor, each of said transistors having a collector, emitter and base electrode; a first control means connecting said first bias winding to said first PNP transistor for applying a biasing potential across its emitter-base junction; a second control means connecting said second bias winding to said second PNP transistor for applying a biasing potential across its emitter-base junction, each of said PNP transistors having a substantially nonconducting condition for one polarity of said biasing potential and a conducting condition for the opposite polarity of said biasing potential, said biasing potential across said bias winding being alternately reversed in response to the condition of said saturation of said magnetic core to cause one of said PNP transistors to be driven in its nonconducting conduction while the other is in the conducting condition; a storage capacitor; circuit means connecting said emitter and collector electrodes of said first PNP transistor, said first primary winding, and said storage capacitor in series between said input terminals to provide a path for current from said unidirectional source to energize said first primary winding and to charge said storage capacitor when said first PNP transistor is driven to a conducting condition; and circuit means connecting said emitter and collector electrodes of said second PNP transistor and said second primary winding in series across said storage capacitor to provide a path for the discharge current from said capacitor to flow through said second primary winding when said second PNP transistor is driven into a conducting condition, and said first and second primary windings being alternately energized from the unidirectional current source and from the storage capacitor to cause an alternating voltage to be induced in said output winding.

5. The electrical oscillator set forth in claim 4 wherein a capacitor is connected in circuit with the collector electrode of said first PNP transistor and with the collector electrode of said second PNP transistor thereby to minimize misfiring of said PNP transistors.

6. An electrical oscillator comprising: input means for connection with a unidirectional source, said input means including an input terminal for connection to one side of the unidirectional source and including a grounding connection, a saturating transformer having a saturable core, a first and a second primary winding, a first and a second bias winding and an output winding all inductively coupled therewith on said saturable core, a first and a second transistor, each of said transistors having an emitter, collector and base electrode, a first control means for driving said first transistor and switching said first transistor into a conducting condition response to the saturation of said saturable core in one direction, said first control means including said first bias winding and a capacitor coupled with said base and one other electrode of said first transistor, a second control means for driving said second transistor and switching said second transistor into a conducting condition in response to the saturation of said magnetic core in the opposing direction, said second control means including said second bias winding and a capacitor coupled with said base and one other electrode of said second transistor, a storage capacitor, circuit means connecting said input terminal, the emitter and collector electrodes of said first transistor, said first primary winding and storage capacitor in circuit with the grounding connection, said storage capacitor being charged and said first primary winding being energized from the unidirectional current source when said first transistor is in a conducting condition, and circuit means connecting said storage capacitor in circuit with the emitter and collector electrodes of said second transistor, said second primary winding and the grounded connection to provide a path for the discharge of current from said storage capacitor thereby to energize said second primary winding when the second transistor is in a conducting condition, said first and second primary windings being alternately energized from the unidirectional current source and from said storage capacitor to cause an alternating voltage to be induced in the output winding.

7. The electrical oscillator set forth in claim 6 wherein a capacitor is connected in circuit with the collector electrode of said first transistor and with the collector electrode of said second transistor thereby to minimize misfirings of said transistors.

8. An electrical oscillator comprising: a saturable transformer having a saturable core, a first and a second primary winding on said core, a first and a second bias winding and an output winding all inductively coupled on said saturable core, input means including a terminal for connection to the positive side of a D.C. source and a grounding connection, a first and a second semiconductor device, each of said semiconductor devices having a control electrode and a main current path, control means including said first and second bias windings respectively coupled to said control electrodes and said main current paths of said first and second semiconductor devices for driving said first semiconductor device and switching said first semiconductor device main current path into a conducting condition in response to the saturation of said magnetic core in one direction and for driving said second semiconductor device and switching said second semiconductor device main current path into a conducting condition in response to the saturation of said magnetic core in the opposing direction, a storage capacitor, a voltage dividing network connected across said input terminal and grounding connection, said voltage network including a tapping connection dividing said network into a first portion and a second portion, circuit means connecting said first semiconductor device main current path and said first primary winding across said first portion and placing said capacitor in circuit across said second portion, said circuit means also connecting said second semiconductor device main current path and said second primary winding in circuit across the second portion of said voltage dividing network, said first and second semiconductor devices being alternately switched into a conducting condition in response to the saturation of said saturable core and causing said first and second primary windings to be alternately energized from said unidirectional current source and from said storage capacitor to produce an alternating voltage in said output winding.

References Cited by the Examiner

UNITED STATES PATENTS

| | | | |
|---|---|---|---|
| 2,783,384 | 2/1957 | Bright et al. | 331—113 |
| 2,965,856 | 12/1960 | Roesel | 331—113 |
| 3,179,901 | 4/1965 | Mills | 331—113 |

FOREIGN PATENTS

| | | |
|---|---|---|
| 1,251,802 | 12/1960 | France. |

ROY LAKE, *Primary Examiner*.

J. KOMINSKI, *Examiner*.